(12) United States Patent
Tamilmani et al.

(10) Patent No.: US 12,410,513 B2
(45) Date of Patent: Sep. 9, 2025

(54) SEAMLESS GAPFILL OF METAL NITRIDES

(71) Applicant: Applied Materials, Inc., Santa Clara, CA (US)

(72) Inventors: Subramanian Tamilmani, Fremont, CA (US); Srinivas Gandikota, Santa Clara, CA (US); Jianqiu Guo, San Jose, CA (US); Luping Li, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 314 days.

(21) Appl. No.: 17/835,463

(22) Filed: Jun. 8, 2022

(65) Prior Publication Data

US 2022/0389568 A1 Dec. 8, 2022

Related U.S. Application Data

(60) Provisional application No. 63/217,492, filed on Jul. 1, 2021, provisional application No. 63/208,338, filed on Jun. 8, 2021.

(51) Int. Cl.
| | |
|---|---|
| *C23C 16/04* | (2006.01) |
| *C23C 16/30* | (2006.01) |
| *C23C 16/455* | (2006.01) |
| *C23C 16/52* | (2006.01) |

(52) U.S. Cl.
CPC ......... *C23C 16/045* (2013.01); *C23C 16/303* (2013.01); *C23C 16/45536* (2013.01); *C23C 16/45544* (2013.01); *C23C 16/52* (2013.01)

(58) Field of Classification Search
None
See application file for complete search history.

(56) References Cited

U.S. PATENT DOCUMENTS

| | | | |
|---|---|---|---|
| 10,014,185 B1 * | 7/2018 | Wu | H01L 21/764 |
| 10,192,775 B2 | 1/2019 | Manna et al. | |
| 2008/0217775 A1 | 9/2008 | Pai | |
| 2008/0311711 A1 | 12/2008 | Hampp et al. | |
| 2009/0075454 A1 | 3/2009 | Ang | |
| 2019/0333753 A1 * | 10/2019 | Ueda | H01L 21/02315 |
| 2020/0027785 A1 * | 1/2020 | Roy | H01L 23/53266 |

* cited by examiner

*Primary Examiner* — Joshua L Allen
*Assistant Examiner* — Bradford M Gates
(74) *Attorney, Agent, or Firm* — Servilla Whitney LLC

(57) ABSTRACT

Methods for filling a substrate feature with a seamless metal gate fill are described. Methods comprise sequentially depositing a film on a substrate surface having at least one feature thereon. The at least one feature extends a feature depth from the substrate surface to a bottom surface and has a width defined by a first sidewall and a second sidewall. The film is treated with an oxidizing plasma. Then the film is etched to remove the oxidized film. A second film is deposited to fill the feature, where the second film substantially free of seams and voids.

20 Claims, 8 Drawing Sheets

SEAMLESS GAPFILL OF METAL NITRIDES

CROSS-REFERENCE TO RELATED APPLICATIONS

This application claims priority to U.S. Provisional Application No. 63/208,338, filed Jun. 8, 2021, and U.S. Provisional Application No. 63/217,492, filed Jul. 1, 2021, the entire disclosures of which are hereby incorporated by reference herein.

TECHNICAL FIELD

Embodiments of the disclosure generally relate to methods for filling substrate features. More particularly, embodiments of the disclosure are directed to methods for filling a substrate feature with a deposition-treatment-etch-deposition scheme.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. Examples of transistor device structures include a planar structure, a fin field effect transistor (FinFET) structure, and a gate all around (GAA) structure.

In manufacturing, three-dimensional (3D) structures, such as FinFETs, GAAs, DRAM word lines, and the like, are made by atomic layer deposition of titanium nitride (TiN) and tungsten (W) stacks. A seam is often observed from an ALD or CVD deposited film. This seam creates issues during downstream processes. Accordingly, there is a need for methods to fill structures without creating a seam.

SUMMARY

One or more embodiments of the disclosure are directed to a processing method. The processing method comprises depositing a first film on a substrate surface, the substrate surface having at least one feature thereon, the at least one feature extending a feature depth from the substrate surface to a bottom surface, the at least one feature having a width defined by a first sidewall and a second sidewall; treating the substrate surface with an oxidizing plasma to form an oxidized film; etching the substrate surface to remove the oxidized film; and depositing a second film on the substrate surface to fill the at least one feature, the second film substantially free of seams and voids.

Another embodiment of the disclosure is directed to a processing method. The processing method comprising: forming a film stack on a substrate, the film stack comprising a plurality of alternating layers of a first material and a second material and the film stack having a stack thickness; etching the film stack to form an opening extending a depth from a top of the film stack surface to a bottom surface, the opening having a width defined by a first sidewall and a second sidewall; depositing a first film on the film stack surface, and on the first sidewall, the second sidewall, and the bottom surface of the opening; treating the film stack with an oxidizing plasma to form an oxidized film on the film stack surface; etching the oxidized film to expose the first film; depositing a second film on the film stack surface, the second film substantially free of seams and voids.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
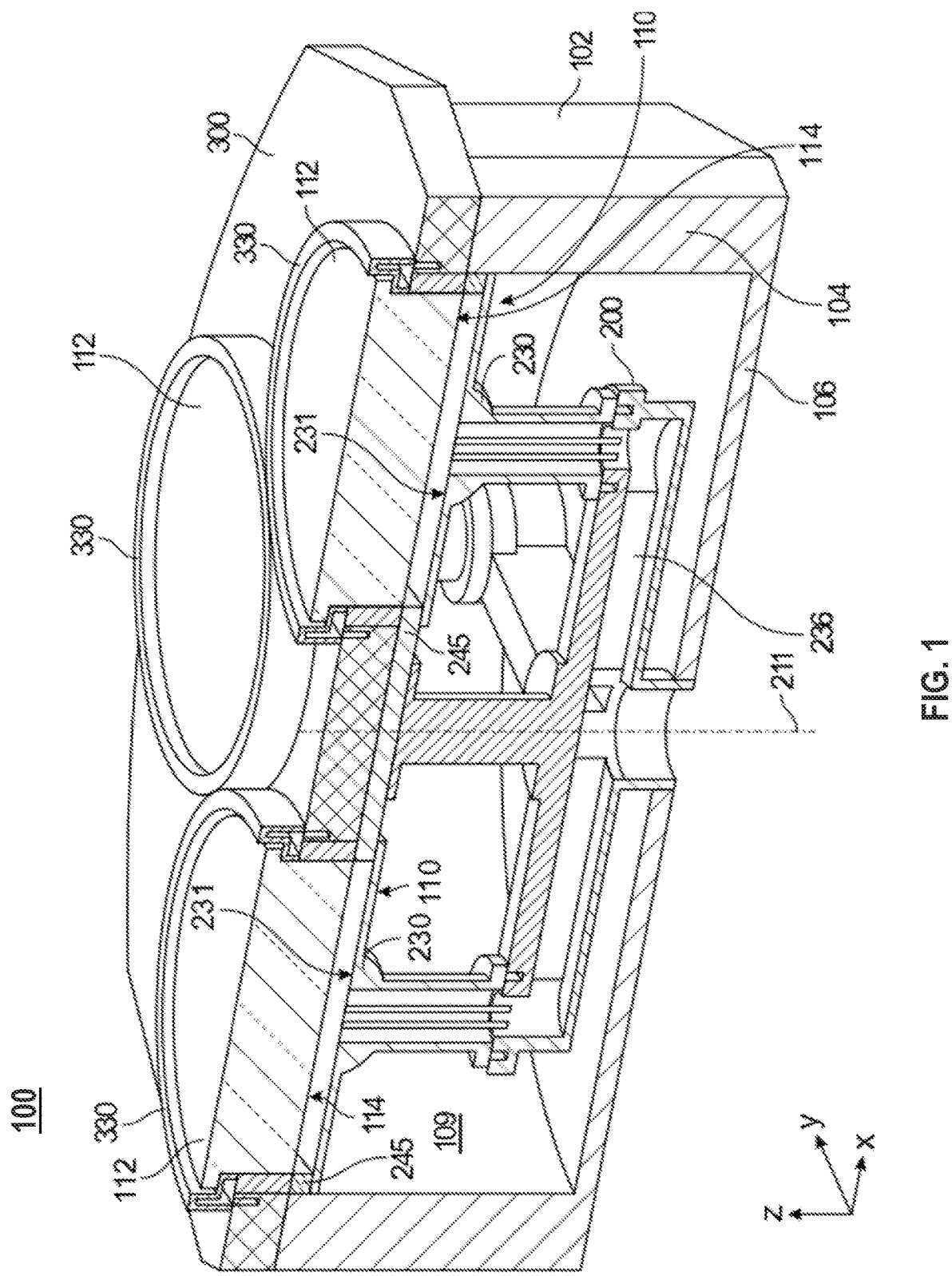
FIG. 1 shows a cross-sectional isometric view of a processing chamber in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

Embodiments of the disclosure provide methods of depositing a metal nitride film (e.g., titanium nitride (TiN), or silicon nitride (SiN)) in high aspect ratio (AR) structures with small dimensions. Some embodiments advantageously provide methods involving cyclic deposition-treatment-etch-deposition processes that can be performed in a batch processing chamber. Some embodiments advantageously provide seam-free high-quality films to fill up high AR trenches with small dimensions.

Figure 2:
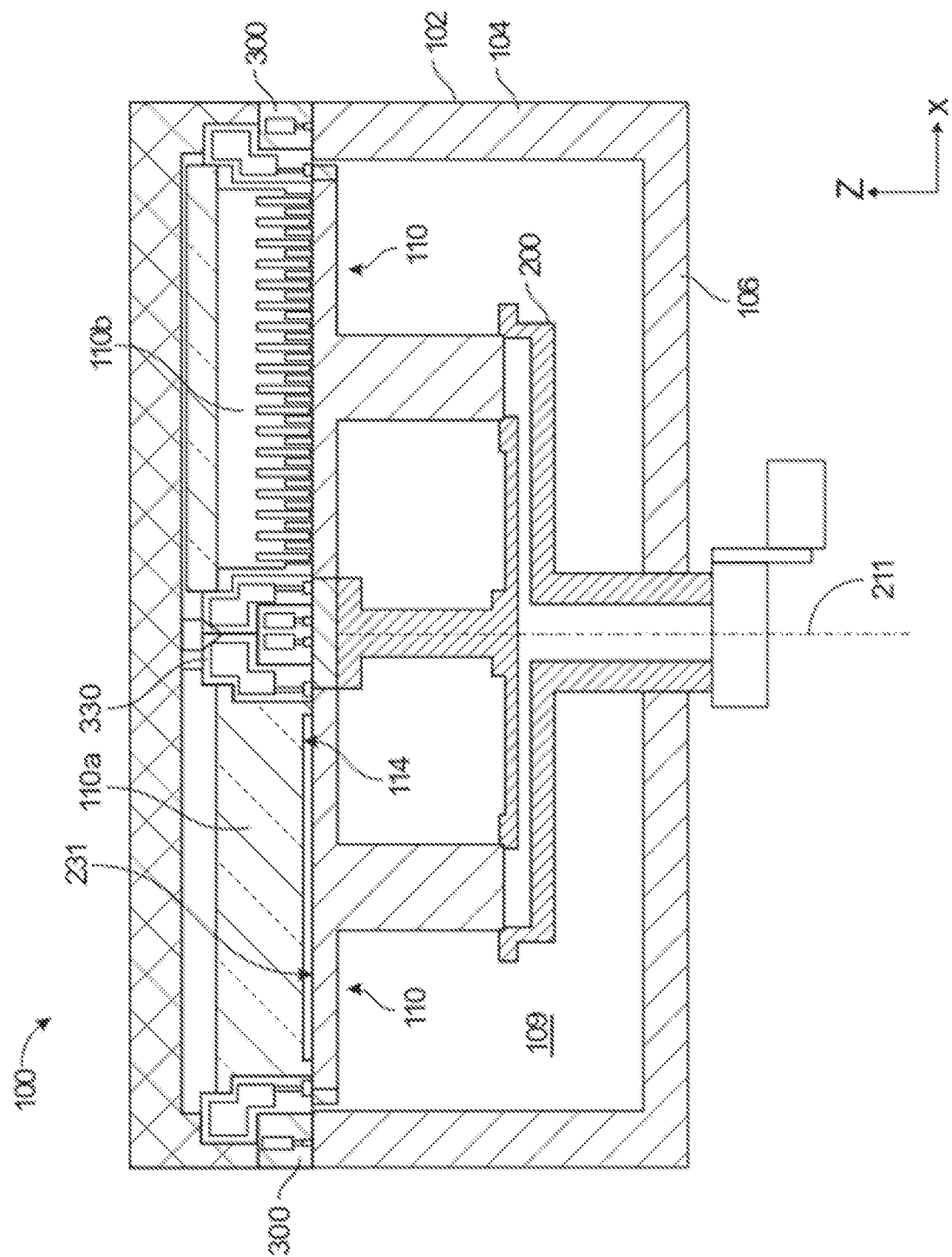
FIG. 2 shows a cross-sectional view of a processing chamber in accordance with one or more embodiments of the disclosure.

The disclosure provides methods for use with single wafer or multi-wafer (also referred to as batch) process chambers. FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a substrate support 200.

The processing chamber 100 has a housing 102 with walls 104 and a bottom 106. The housing 102 along with the top plate 300 define a processing volume 109, also referred to as an interior volume.

The processing chamber 100 illustrated includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas injectors 112 are substantially coplanar. The processing stations 110 are defined as a region in which processing can occur. For example, in some embodiments, a processing station 110 is defined as a region bounded by the support surface 231 of the substrate support 200, as described below, and the front surface 114 of the gas injectors 112. In the illustrated embodiment, heaters 230 act as the substrate support surfaces and form part of the substrate support 200.

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition apparatus may have a showerhead or vortex type gas injector. Whereas a processing station 110 configured to operate as a plasma station may have one or more electrode and/or grounded plate configuration to generate a plasma while allowing a plasma gas to flow toward the wafer. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
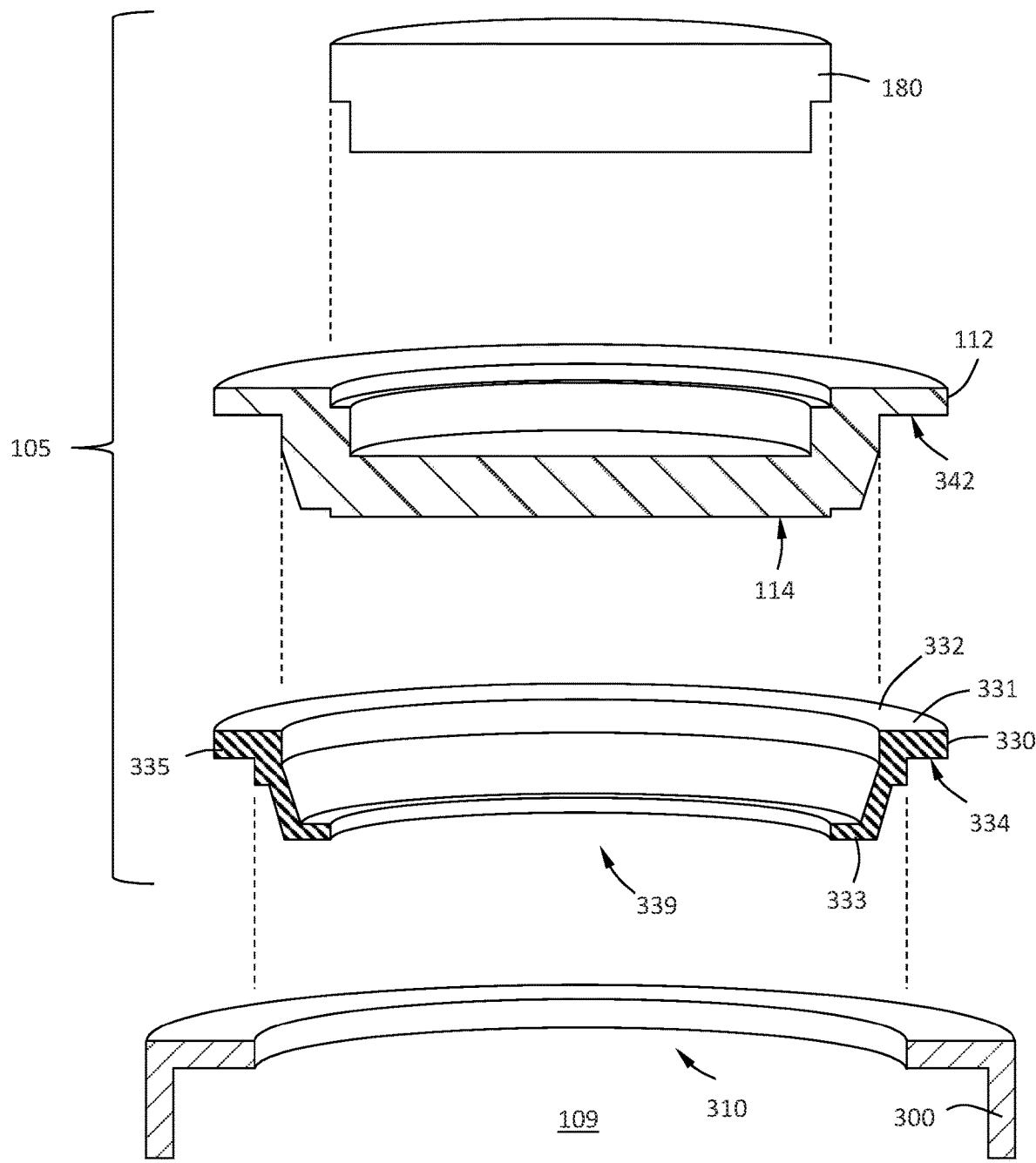
FIG. 3 is an exploded cross-sectional view of a processing station in accordance with one or more embodiments of the disclosure.

FIG. 3 illustrates an exploded view of a gas distribution assembly 105 for use in a processing station 110 or a process chamber in accordance with one or more embodiment of the disclosure. The skilled artisan will recognize that embodiment illustrated in FIG. 3 is a general schematic and omits details (e.g., gas channels). The gas distribution assembly 105 illustrated comprises three main components: a gas distribution plate 112, a lid 180 and an optional spacer 330. The spacer 330 is also referred to as a pump/purge spacer, insert or pump/purge insert. In some embodiments, the spacer 330 is connected to or in fluid communication with a vacuum (exhaust). In some embodiments, the spacer 330 is connected to or in fluid communication with a purge gas source.

The openings 310 in the top plate 300 can be uniformly sized or have different sizes. Different sized/shape gas injectors 112 can be used with a pump/purge spacer 330 that is suitably shaped to transition from the opening 310 to the gas distribution plate 112. For example, as illustrated, the pump/purge spacer 330 includes a top 331 and bottom 333 with a sidewall 335. When inserted into the opening 310 in the top plate 300, a ledge 334 is configured to be positioned in the opening 310.

The pump/purge spacer 330 includes an opening 339 in which a gas distribution plate 112 can be inserted. The gas distribution plate 112 illustrated has a flange 342 which can be in contact with the ledge formed by the back surface 332 adjacent the top 331 of the pump/purge spacer 330. The diameter or width of the gas distribution plate 112 can be any suitable size that can fit within the opening 339 of the pump/purge spacer 330. This allows gas injectors 112 of various types to be used within the same opening 310 in the top plate 300.

Figure 4:
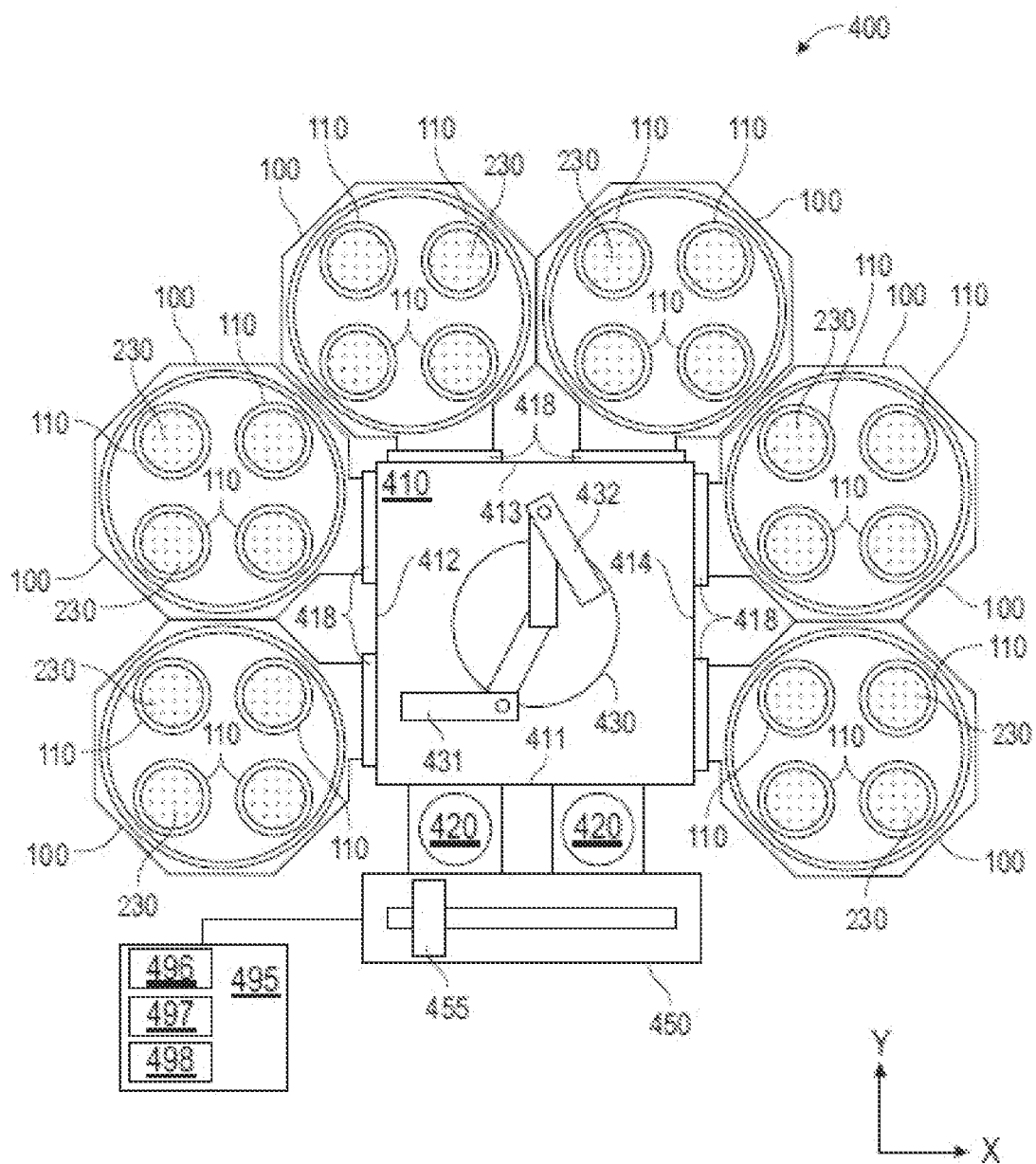
FIG. 4 is a schematic representation of a processing platform in accordance with one or more embodiments of the disclosure.

FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different number of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support 200 (FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 497 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control, or other components.

Figure 5:
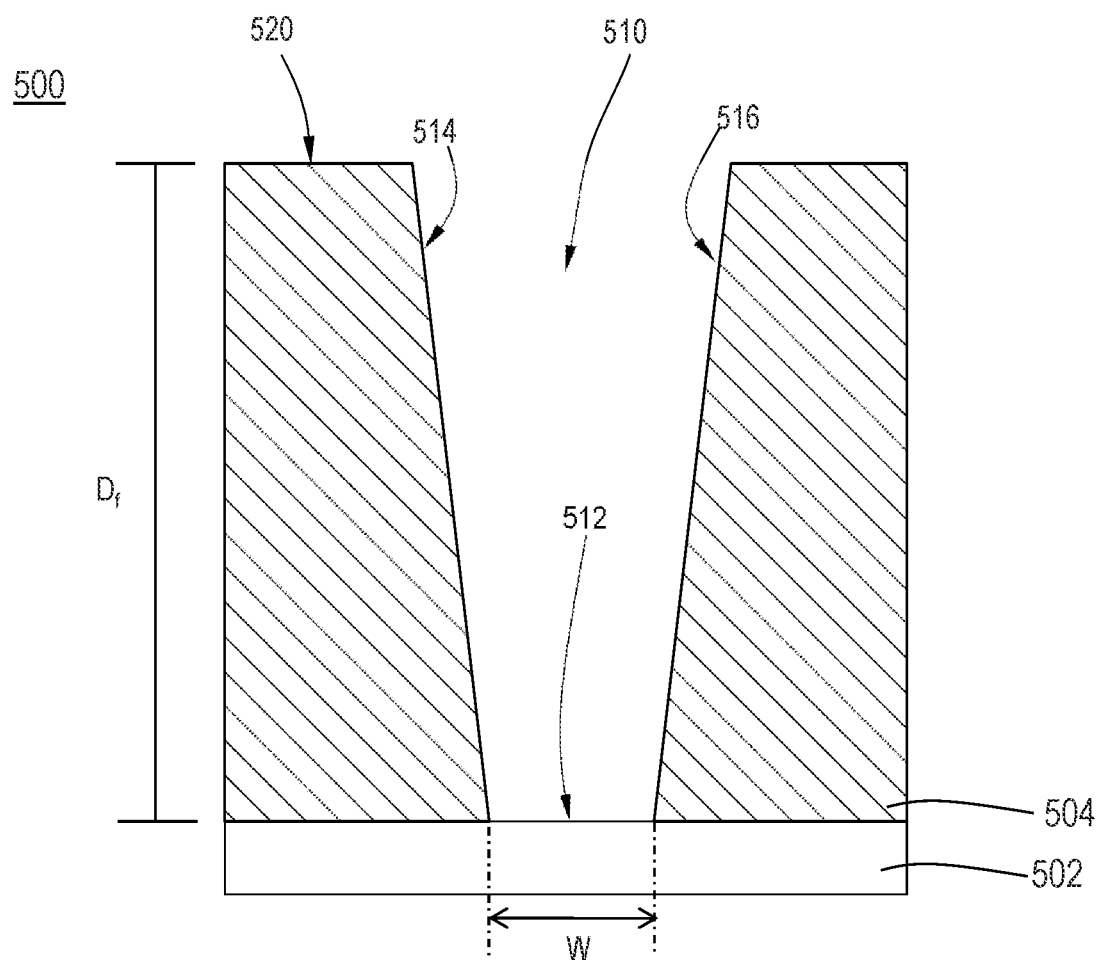
FIG. 5 shows a cross-sectional view of a substrate feature in accordance with one or more embodiments of the disclosure.
Figure 6A:
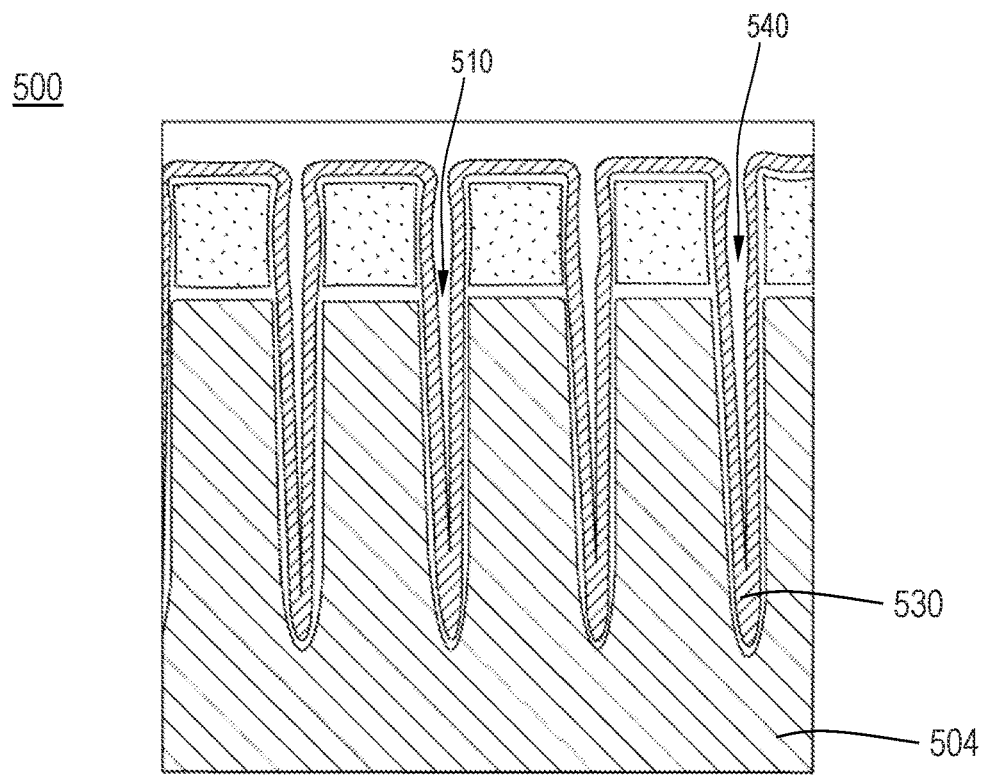
FIGS. 6A-6D show a cross-sectional view of a substrate in accordance with the method of one or more embodiments of the disclosure.
Figure 6B:
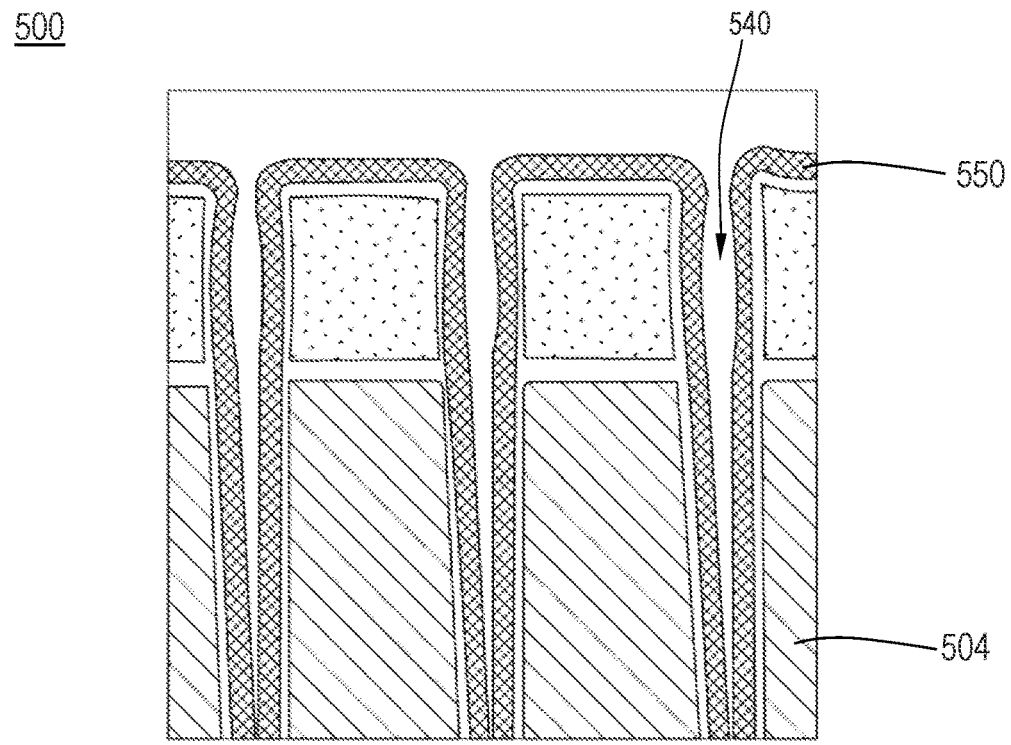
Figure 6C:
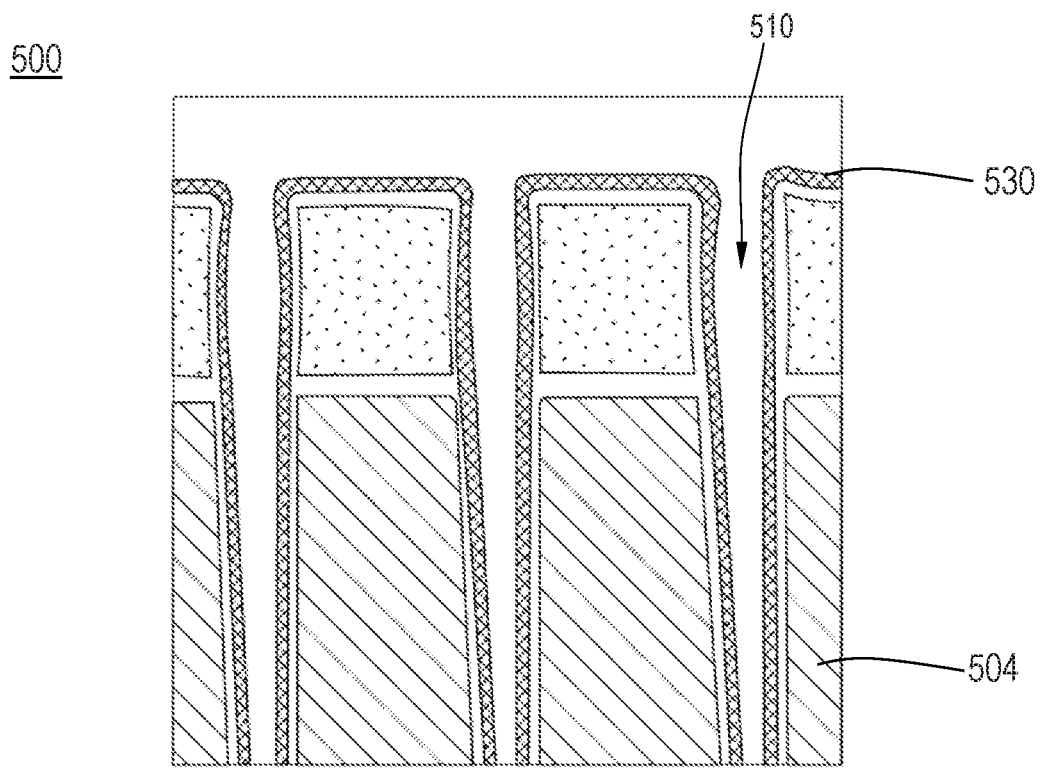
Figure 6D:
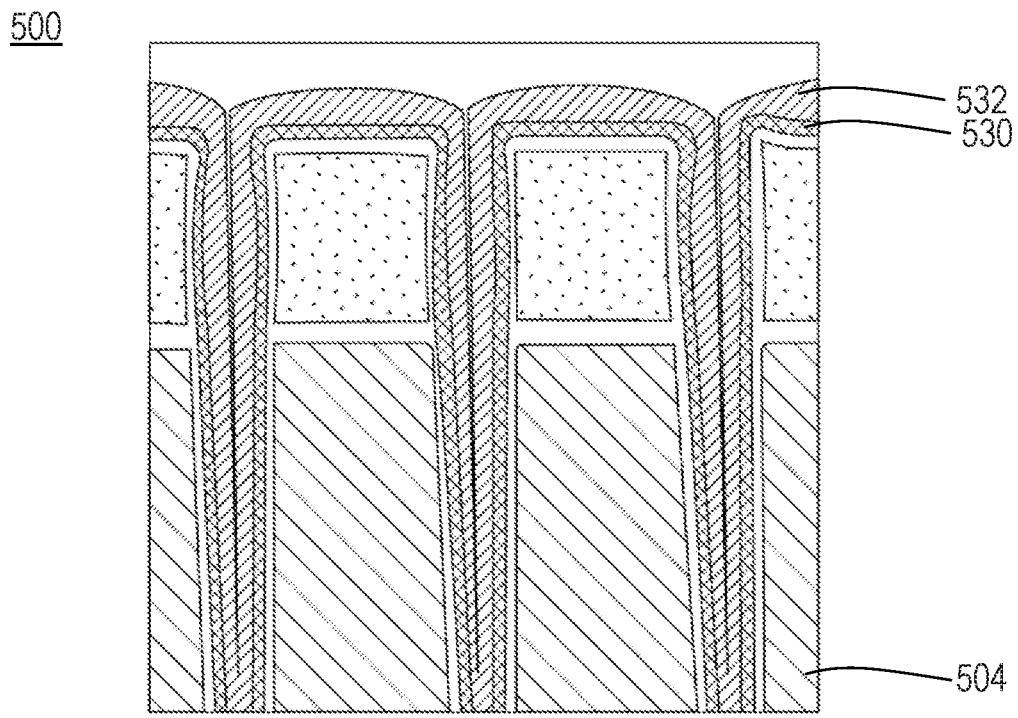

FIGS. 5 through 6D illustrate partial cross-sectional views of a substrate 500 (e.g., a semiconductor substrate 500) with at least one feature 510 according to a method of one or more embodiments. The Figures show substrates having a single feature for illustrative purposes; however, those skilled in the art will understand that there can be more than one feature. The shape of the feature 510 can be any suitable shape including, but not limited to, trenches and cylindrical vias. As used in this regard, the term "feature" means any intentional surface irregularity. Suitable examples of features include, but are not limited to, trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1, 40:1, 45:1, 50:1, 75:1, or 100:1.

With reference to FIG. 5, the substrate 500 has a substrate surface 520. The at least one feature 510 forms an opening in the substrate surface 520. The at least one feature 510 extends from the substrate surface 520 to a feature depth $D_f$ to a bottom surface 512. The at least one feature 510 has a first sidewall 514 and a second sidewall 516 that define a width W of the at least one feature 510. The open area formed by the sidewalls 514, 516 and the bottom surface 512 are also referred to as a gap. In one or more embodiments, the width W is homogenous along the depth $D_1$ of the at least one feature 510. In other embodiments, the width, W, is greater at the top of the at least one feature 510 than the width, W, at the bottom surface 512 of the at least one feature 510.

In one or more unillustrated embodiments, the substrate 500 is a film stack comprising a plurality of alternating layers of a first material and a second material. In some embodiments, the substrate 500 is a film stack comprising a plurality of alternating layers of a nitride material and an oxide material deposited on a semiconductor substrate. In other embodiments, the substrate 500 is a film stack comprising a plurality of alternating layers of silicon and silicon germanium on a semiconductor substrate.

The semiconductor substrate 500 can be any suitable substrate material. In one or more embodiments, the semiconductor substrate 500 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 500 comprises one or more of silicon (Si), germanium (Ge), gallium (Ga), arsenic (As), indium (In), phosphorus (P), copper (Cu), or selenium (Se). Although a few examples of materials from which the substrate 500 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the at least one feature 510 comprises a memory hole or a word line slit. Accordingly, in one or more embodiments, the substrate 500 comprises a transistor, a memory device, or a logic device, e.g., FinFET, GAA, DRAM, VNAND, or the like.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "gate all-around (GAA)," is used to refer to an electronic device, e.g., a transistor, in which the gate material surrounds the channel region on all sides. The channel region of a GAA transistor may include nanowires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nano-structure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., VNAND) devices.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor and sensed by turning on the same transistor and looking at the voltage perturbation created by dumping the charge packet on the interconnect line on the transistor output. Thus, a single DRAM cell is made of one transistor and one capacitor. The DRAM device is formed of an array of DRAM cells.

The rows on access transistors are linked by word lines, and the transistor inputs/outputs are linked by bit lines. Historically, DRAM capacitors have evolved from planar polysilicon-oxide-substrate plate capacitors to 3-D structures which have diverged into "stack" capacitors with both plates above the substrate, and "trench" capacitors using an etched cavity in the substrate as the common plate.

Current DRAM buried word line (bWL) processes involve titanium nitride (TiN) and tungsten (W) stacks. Due to the poor adhesion between metal and trench structures, however, voiding and delamination of the metal fill is often observed during high-temperature post anneal treatments. Such voids and delamination are undesired because it will cause problems for subsequent planarization or etching processes. Voids and delamination also contribute to an increase in stack resistance. Accordingly, embodiments of the present disclosure provide processes for making a stack in a DRAM buried word line (bWL) on a substrate which advantageously does not have a seam.

Traditionally, DRAM cells have recessed high work-function metal structures in buried word line structure. In a DRAM device, a bit line is formed in a metal level situated above the substrate, while the word line is formed at the polysilicon gate level at the surface of the substrate. In a buried word line (bWL) device, a word line is buried below the surface of a semiconductor substrate using a metal as a gate electrode.

Figure 7:
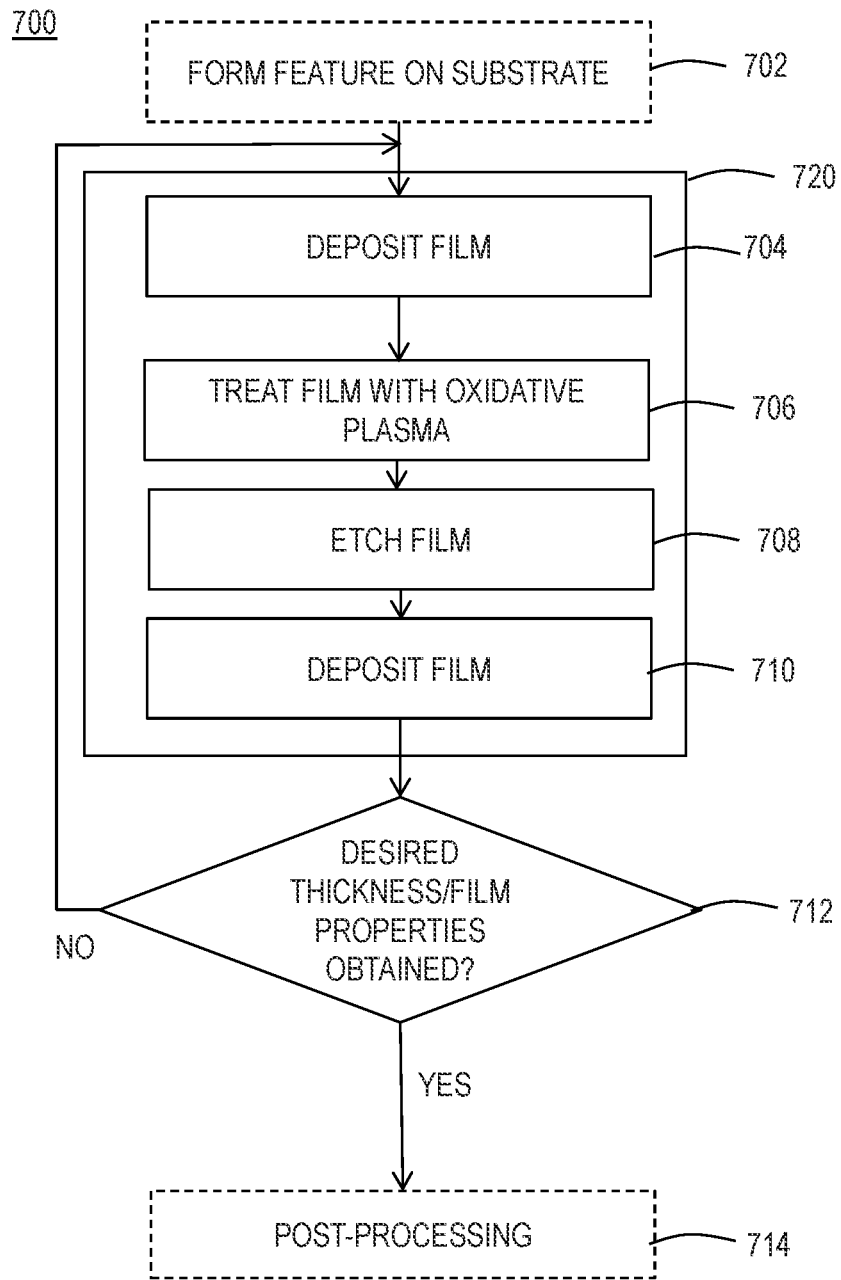
FIG. 7 shows a process flow in accordance with one or more embodiment of the disclosure.

FIGS. 6A through 6D show a cross-sectional schematic of a metal gate fill process in accordance with one or more embodiments of the disclosure. FIG. 7 illustrates a process flow diagram of a method 700 in accordance with one or more embodiments of the disclosure. With reference to FIGS. 5 through 6D and FIG. 7, in one or more embodiments, at least one feature 510 is formed on a substrate 500. In some embodiments, the substrate 500 is provided for processing prior to operation 702. As used in this regard, the term "provided" means that the substrate is placed into a position or environment for further processing. In one or more embodiments, the substrate 500 has at least one feature 510 already formed thereon. In other embodiments, at operation 702, at least one feature 510 is formed on a substrate 500. In one or more embodiments, the at least one feature extends a feature depth, $D_f$, from the substrate surface 520 to a bottom surface, the at least one feature having a width, W, defined by a first sidewall 514 and a second sidewall 516.

In one or more embodiments, at operation 704, a first film 530 is formed on the substrate surface 520 and the sidewalls 514, 516 and the bottom of the at least one feature 510. As illustrated in FIG. 6A, in one or more embodiments, the first film 530 has a void 540 located within the width, W, of the at least one feature 510.

In one or more embodiments, the first film 530 can be comprised of any suitable material. In some embodiments, the first film 530 comprises a metal nitride. In one or more embodiments, the metal nitride comprises one or more of titanium nitride (TiN), tantalum nitride (TaN), tungsten nitride (WN), silicon nitride (SiN), aluminum nitride (AlN), and the like. In one or more embodiments, the first film 530 is formed by atomic layer deposition or chemical vapor deposition.

"Atomic layer deposition" or "cyclical deposition" as used herein refers to the sequential exposure of two or more reactive compounds to deposit a layer of material on a substrate surface. The substrate, or portion of the substrate, is exposed sequentially or separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially.

In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g., manganese precursor, ruthenium precursor, or a manganese-ruthenium precursor) is pulsed into the reaction zone followed by a first time delay. Next, a second precursor or compound B (e.g., reductant) is pulsed into the reaction zone followed by a second delay. During each time delay, a purge gas, such as argon, may be introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B, and purge gas is a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The precursor-containing process gas may be provided in one or more pulses or continuously. The flow rate of the precursor-containing process gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The precursor can be provided at any suitable pressure including, but not limited to, a pressure in the range of about 5 mTorr to about 500 Torr, or in the range of about 100 mTorr to about 500 Torr, or in the range of about 5 Torr to about 500 Torr, or in the range of about 50 mTorr to about 500 Torr, or in the range of about 100 mTorr to about 500 Torr, or in the range of about 200 mTorr to about 500 Torr.

The period of time that the substrate is exposed to the one or more precursor-containing process gas may be any suitable amount of time necessary to allow the precursor to form an adequate nucleation layer atop the conductive surface of the bottom of the opening. For example, the process gas may be flowed into the process chamber for a period of about 0.1 seconds to about 90 seconds. In some time-domain ALD processes, the precursor-containing process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert carrier gas may additionally be provided to the process chamber at the same time as the precursor-containing process gas. The carrier gas may be mixed with the precursor-containing process gas (e.g., as a diluent gas) or separately and can be pulsed or of a constant flow. In some embodiments, the carrier gas is flowed into the processing chamber at a constant flow in the range of about 1 to about 10000 sccm. The carrier gas may be any inert gas, for example, such as argon, helium, neon, combinations thereof, or the like. In one or more embodiments, a precursor-containing process gas is mixed with argon prior to flowing into the process chamber.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Suitable precursors include, but are not limited to, silane, disilane, dichlorosilane (DCS), trisilane, tetrasilane, titanium chloride, tantalum chloride, tungsten chloride, aluminum chloride, titanium fluoride, tantalum fluoride, tungsten fluoride, aluminum fluoride, and the like. In one or more embodiments, the precursor may be heated in a hot can to increase the vapor pressure and be delivered to the chamber using a carrier gas (e.g., ultrahigh purity (UHP) Ar, He, $H_2$, etc.).

In some embodiments, the first film 530 forms conformally on the at least one feature 510. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the first film 530 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

With reference to FIG. 6A, in one or more embodiments, a void 540 may be formed within the width, W, of the at least one feature 510. The shape and size of the void 540 can vary.

Referring to FIG. 6A and FIG. 7, in one or more embodiments, at operation 706, the film is treated with an oxidizing plasma to oxidize a portion of the first film 530, forming an oxide film 550. The plasma may comprise any suitable oxidizing plasma known to the skilled artisan. In one or more embodiments, the oxidizing plasma comprises one or more of oxygen ($O_2$), nitrous oxide ($N_2O$), water ($H_2O$), ozone ($O_3$), and the like.

In some embodiments, about 10% of the first film 530 is converted to an oxide film 550. In other embodiments, about 20% or about 30% or about 50% or about 60% or about 70% of the first film 530 form an oxide film 550. In one or more embodiments, the oxide film 550 comprises an oxidized metal nitride film. In one or more embodiments, the oxide film 550 comprises one or more of titanium oxynitride (TiON), tantalum oxynitride (TaON), tungsten oxynitride (WON), silicon oxynitride (SiON), aluminum oxynitride (AlON), and the like.

Referring to FIG. 6C and FIG. 9, at operation 708, the substrate 500 is etched to remove the oxide film 550 and expose the portion of first film 530 that was not oxidized by the oxidating plasma.

The substrate may be etched, the oxide film 550 selectively removed, by any process known to one of skill in the art, including, but not limited to, wet etching, plasma-based sputter etching, chemical etching, Siconi® etching, reactive ion etching (RIE), high density plasma (HDP) etching, and the like. In some embodiments, etching the comprises exposing the substrate to an etch chemistry comprising a halide. In one or more embodiments, the oxide film 550 is etched by a dry etch halide process.

Referring to FIG. 6D and FIG. 7, in one or more embodiments, at operation 710, a second film 532 is deposited in the at least one feature 510 and on the substrate surface 520.

In one or more embodiments, the second film 532 can comprise any suitable material. In some embodiments, the second film 532 comprises a metal nitride film. In one or more embodiments, the metal nitride comprises one or more of titanium nitride (TiN), tantalum nitride (TaN), tungsten nitride (WN), silicon nitride (SiN), aluminum nitride (AlN), and the like.

In one or more embodiments, the second film 532 is formed by atomic layer deposition or chemical vapor deposition. In one or more embodiments, the first film 530 and the second film 532 comprise the same material. In other embodiments, the first film 530 and the second film 532 comprise different materials.

Referring to FIG. 7, after the completion of process cycle 720, decision 712 is reached. After a suitable number of sequences or cycles of deposition and treatment and etch, the metal nitride film formed will have substantially no seam to completely fill the gap of the feature 510, as illustrated in FIG. 6D. As used in this specification and the appended claims, the term "substantially no seam", and the like, means that a seam takes up less than about 1% of the volume of the feature 510. Referring to FIG. 6D and FIG. 7, substantially no seam is present. Thus, decision 712 would direct the process out of the deposition/treatment/etch loop to one or more optional post-processing treatments 714.

In some embodiments, operations 704, 706, 708, and 710 are integrated such that there is no vacuum break between each operation. In some embodiments, operations 704 and

706 are integrated such that there is no vacuum break. In some embodiments, operations 704. 706, and 708 are integrated such that there is no vacuum break.

According to one or more embodiments, the substrate is subjected to processing prior to and/or after forming the layer. This processing can be performed in the same chamber or in one or more separate processing chambers.

Some embodiments of the disclosure are directed to film deposition processes using a batch processing chamber, also referred to as a spatial processing chamber. In one or more embodiments, the batch processing chamber may be any batch processing chamber known to one of skill in the art. In one or more embodiments, the deposition/treatment/etching/deposition occurs in the same processing tool. In one or more embodiments, the process zones in batch processing chamber are plasma etch capable.

Several well-known cluster tools which may be adapted for the present disclosure are the Olympia®, the Continuum®, and the Trillium®, all available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), plasma treatment, etch, pre-clean, chemical clean, thermal treatment such as RTP, plasma nitridation, degas, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
  depositing a first film on a substrate surface, the substrate surface having at least one feature thereon, the at least one feature extending a feature depth from the substrate surface to a bottom surface, the at least one feature having a width defined by a first sidewall and a second sidewall, the first film forming conformally on the substrate surface, and on the first sidewall, the second sidewall, and the bottom surface of the at least one feature, and having a void located within the width of the at least one feature;
  treating the substrate surface with an oxidizing plasma to oxidize a portion of the first film formed on the substrate surface, and on the first sidewall, the second sidewall, and the bottom surface of the at least one feature, and form an oxidized film;
  etching the substrate surface to remove the oxidized film; and
  depositing a second film on the substrate surface to fill the at least one feature, the second film substantially free of seams and voids.

2. The method of claim 1, wherein the first film and the second film independently comprise a metal nitride.

3. The method of claim 2, wherein the metal nitride comprises one or more of titanium nitride (TiN), tantalum nitride (TaN), tungsten nitride (WN), silicon nitride (SiN), and aluminum nitride (AlN).

4. The method of claim 3, wherein the oxidized film comprises one or more of titanium oxynitride (TiON), tantalum oxynitride (TaON), tungsten oxynitride (WON), silicon oxynitride (SiON), and aluminum oxynitride (AlON).

5. The method of claim 1, wherein depositing the first film, and depositing the second film comprises an atomic layer deposition process.

6. The method of claim 1, further comprising repeating the method n number of times, wherein n is a number less than or equal to 40 cycles.

7. The method of claim 1, wherein the feature has an aspect ratio greater than or equal to about 10:1.

8. The method of claim 1, wherein the oxidizing plasma comprises one or more of oxygen ($O_2$), nitrous oxide ($N_2O$), water ($H_2O$), and ozone ($O_3$).

9. The method of claim 1, wherein about 10% to about 70% of the first film is converted to the oxidized film.

10. A processing method comprising:
  forming a film stack on a substrate, the film stack comprising a plurality of alternating layers of a first material and a second material and the film stack having a stack thickness;
  etching the film stack to form an opening extending a depth from a top of the film stack surface to a bottom surface, the opening having a width defined by a first sidewall and a second sidewall;
  depositing a first film on the film stack surface, the first film forming conformally on the film stack surface, and on the first sidewall, the second sidewall, and the bottom surface of the opening, and having a void located within the width of the opening;
  treating the film stack with an oxidizing plasma to oxidize a portion and form an oxidized film on the film stack surface, and on the first sidewall, the second sidewall, and the bottom surface of the opening;
  etching the oxidized film to expose the first film; and
  depositing a second film on the film stack surface to fill the opening, the second film substantially free of seams and voids.

11. The method of claim 10, wherein the first film and the second film independently comprise a metal nitride.

12. The method of claim 11, wherein the metal nitride comprises one or more of titanium nitride (TiN), tantalum nitride (TaN), tungsten nitride (WN), silicon nitride (SiN), and aluminum nitride (AlN).

13. The method of claim 12, wherein the oxidized film comprises one or more of titanium oxynitride (TiON), tantalum oxynitride (TaON), tungsten oxynitride (WON), silicon oxynitride (SiON), and aluminum oxynitride (AlON).

14. The method of claim 10, wherein depositing the first film, and depositing the second film comprises an atomic layer deposition process.

15. The method of claim 10, further comprising repeating the method n number of times, wherein n is a number less than or equal to 40 cycles.

16. The method of claim 10, wherein the first material and the second material independently comprise one or more of silicon oxide (SiOx), silicon nitride (SiN), silicon (Si), and silicon germanium (SiGe).

17. The method of claim 10, wherein the oxidizing plasma comprises one or more of oxygen ($O_2$), nitrous oxide ($N_2O$), water ($H_2O$), and ozone ($O_3$).

18. The method of claim 10, wherein about 10% to about 70% of the first film is converted to the oxidized film.

19. A non-transitory computer readable medium including instructions, that, when executed by a controller of a processing chamber, causes the processing chamber to perform the operations of:
  deposit a first film on a substrate surface, the substrate surface having at least one feature thereon, the at least one feature extending a feature depth from the substrate surface to a bottom surface, the at least one feature having a width defined by a first sidewall and a second sidewall, the first film forming conformally on the substrate surface, and on the first sidewall, the second sidewall, and the bottom surface of the at least one feature, and having a void located within the width of the at least one feature;
  treat the substrate surface with an oxidizing plasma to form an oxidized film from the conformal first film on the substrate surface, and on the first sidewall, the second sidewall, and the bottom surface of the at least one feature;
  etch the substrate surface to remove the oxidized film; and
  deposit a second film on the substrate surface to fill the at least one feature, the second film substantially free of seams and voids.

20. The non-transitory computer readable medium of claim 19, further including instructions, that, when executed by a controller of a processing chamber, causes the processing chamber to perform the further operation of:
  repeat the operations of depositing the first film on the substrate surface, treating the substrate surface with the oxidizing plasma, etching the substrate surface, and depositing the second film, n number of times, wherein n is a number less than or equal to 40 cycles.

* * * * *